United States Patent

(12) United States Patent
Motegi

(10) Patent No.: US 11,231,655 B2
(45) Date of Patent: Jan. 25, 2022

(54) CONTROL APPARATUS, EXPOSURE APPARATUS, AND MANUFACTURING METHOD FOR ARTICLE

(71) Applicant: CANON KABUSHIKI KAISHA, Tokyo (JP)

(72) Inventor: Takeshi Motegi, Utsunomiya (JP)

(73) Assignee: CANON KABUSHIKI KAISHA, Tokyo (JP)

(*) Notice: Subject to any disclaimer, the term of this patent is extended or adjusted under 35 U.S.C. 154(b) by 0 days.

(21) Appl. No.: 16/751,813

(22) Filed: Jan. 24, 2020

(65) Prior Publication Data
US 2020/0241430 A1  Jul. 30, 2020

(30) Foreign Application Priority Data

Jan. 29, 2019  (JP) .............................. JP2019-013061

(51) Int. Cl.
*G03F 7/20*  (2006.01)
(52) U.S. Cl.
CPC ................................ G03F 7/70725 (2013.01)
(58) Field of Classification Search
CPC .................................................. G03F 7/70725
See application file for complete search history.

(56) References Cited

U.S. PATENT DOCUMENTS

| | | | | |
|---|---|---|---|---|
| 2004/0201834 A1* | 10/2004 | Uchida | ................... | H01J 37/20 355/72 |
| 2006/0170888 A1* | 8/2006 | Asano | ..................... | H02P 23/04 355/53 |
| 2008/0266907 A1* | 10/2008 | Kim | ......................... | H02M 1/36 363/21.1 |
| 2013/0026924 A1* | 1/2013 | Jong | ...................... | H05B 45/48 315/113 |
| 2015/0103328 A1* | 4/2015 | Motegi | ............... | G03F 7/70725 355/72 |
| 2015/0303841 A1* | 10/2015 | Suzuki | ..................... | H02P 25/06 318/38 |
| 2016/0373045 A1* | 12/2016 | Hirota | ...................... | H02P 27/08 |
| 2016/0381773 A1* | 12/2016 | Gyoten | .................. | H05B 45/44 315/122 |
| 2017/0077712 A1* | 3/2017 | Sugisawa | ................ | H05B 45/32 |
| 2017/0288589 A1* | 10/2017 | Sato | ......................... | H02P 6/085 |
| 2018/0254733 A1* | 9/2018 | Kawamura | ............. | H02P 21/22 |

(Continued)

FOREIGN PATENT DOCUMENTS

JP  2013031204 A  2/2013

*Primary Examiner* — Deoram Persaud
(74) *Attorney, Agent, or Firm* — Rossi, Kimms & McDowell LLP

(57) ABSTRACT

To provide a control apparatus, with which driving of a driving unit can be controlled with high accuracy with a simple configuration, the control apparatus (100) according to the present invention include: a plurality of current sources (20) each being configured to supply current based on a PWM method; a first detection unit configured to detect a driving state of a driving unit (14); and a control unit (50) configured to change values of a plurality of currents (Ixf, Ixb, Iyl, and Iyr) which are supplied from the plurality of current sources (20) based on a result of the detection by the first detection unit, and which are required to drive the driving unit (14), when a value of at least one of the plurality of currents (Ixf, Ixb, Iyl, and Iyr) is a predetermined value.

17 Claims, 7 Drawing Sheets

(56) References Cited

U.S. PATENT DOCUMENTS

| | | | | |
|---|---|---|---|---|
| 2018/0301977 A1* | 10/2018 | Yamada | ............... | H03K 17/166 |
| 2019/0193975 A1* | 6/2019 | Hamano | ................ | B65H 20/02 |
| 2020/0012200 A1* | 1/2020 | Kurihara | ............. | G03F 7/70358 |
| 2020/0028457 A1* | 1/2020 | Zhou | ....................... | H02P 6/182 |
| 2020/0266732 A1* | 8/2020 | Kaidu | ..................... | H02P 23/28 |

* cited by examiner

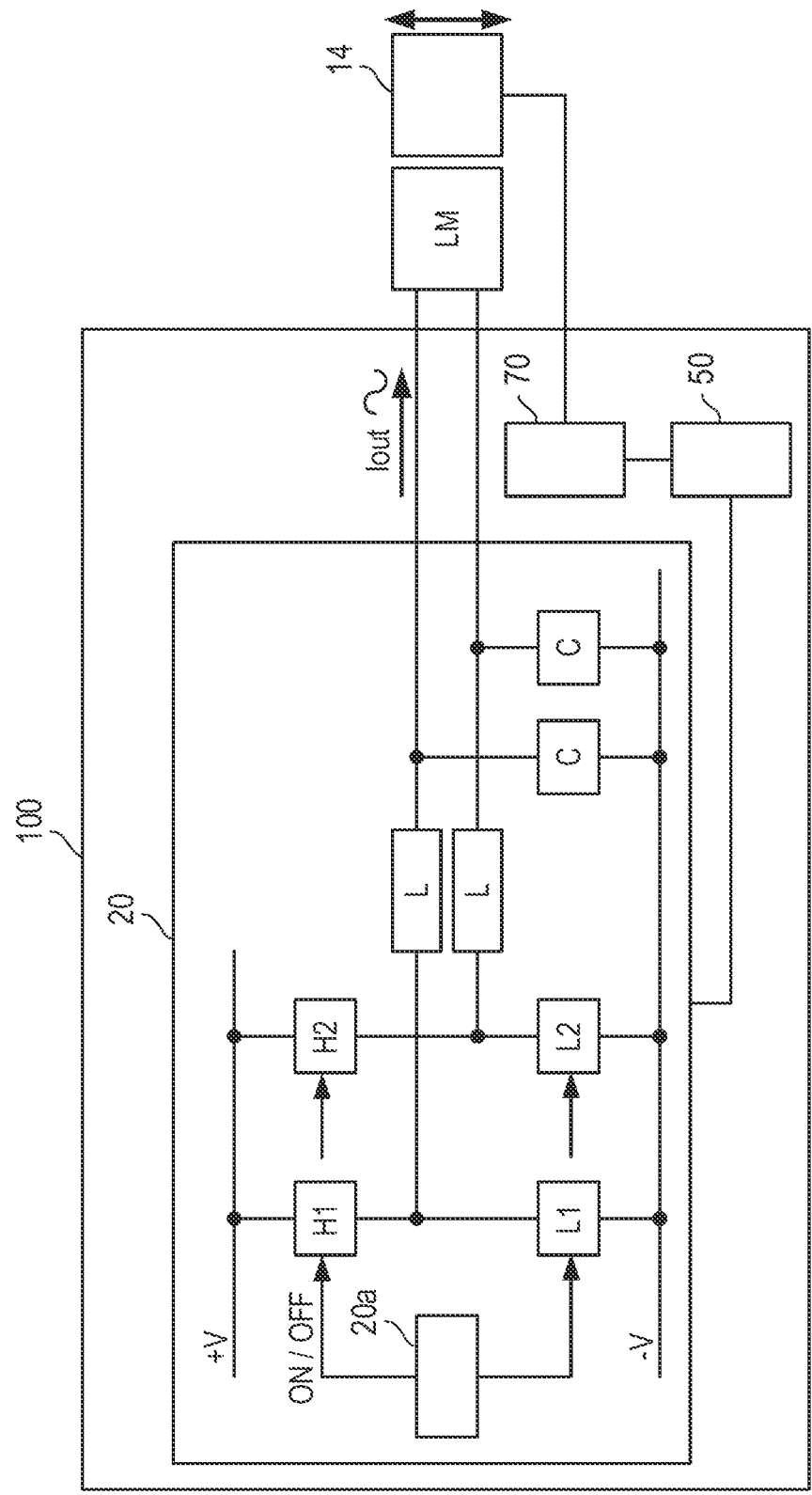

CONTROL APPARATUS, EXPOSURE APPARATUS, AND MANUFACTURING METHOD FOR ARTICLE

BACKGROUND OF THE INVENTION

Field of the Invention

The present invention relates to a control apparatus, and more particularly, to a control apparatus suitable to control driving of a stage in an exposure apparatus.

Description of the Related Art

Along with recent advances toward high-speed driving of a stage aimed at improving productivity of a semiconductor exposure apparatus, a control apparatus for driving such a stage is required to enable large current and high voltage.

In the control apparatus adapted to enable large current and high voltage and configured to control driving of a driving unit, for example, for a stage, a current amplifier that adopts a PWM method is provided as a current source for supplying current required to drive the driving unit.

However, the PWM method is a modulation method that uses a reference wave, and hence nonlinear components are included. It has been known that distortion is involved in dead time and further in output current due to the effect of the nonlinear components.

In Japanese Patent Application Laid-Open No. 2013-31204, there is disclosed a PWM amplifier including a dead time compensation circuit configured to apply offset voltage to reduce distortion.

However, when distortion of output current is to be compensated for as in the PWM amplifier disclosed in Japanese Patent Application Laid-Open No. 2013-31204, an additional compensation circuit is required, and hence a control apparatus including such a PWM amplifier is disadvantageously complicated.

In view of the above, an object of the present invention is to provide a control apparatus with which driving of a driving unit can be controlled with high accuracy with a simple configuration, an exposure apparatus, and a manufacturing method for an article.

SUMMARY OF THE INVENTION

According to one embodiment of the present invention, there is provided a control apparatus including: a plurality of current sources each being configured to supply current based on a PWM method; a first detection unit configured to detect a driving state of a driving unit; and a control unit configured to change values of a plurality of currents which are supplied from the plurality of current sources based on a result of the detection by the first detection unit, and which are required to drive the driving unit, when a value of at least one of the plurality of currents is a predetermined value.

Further features of the present invention will become apparent from the following description of exemplary embodiments with reference to the attached drawings.

BRIEF DESCRIPTION OF THE DRAWINGS

FIG. 1 is a block diagram for illustrating one of control apparatus according to a first embodiment of the present invention.

DESCRIPTION OF THE EMBODIMENTS

A control apparatus according to an embodiment of the present invention is described below in detail with reference to the accompanying drawings. Some of the drawings referred to below may be drawn in scales different from the actual scale for easier understanding of the embodiment.

First Embodiment

Figure 7:
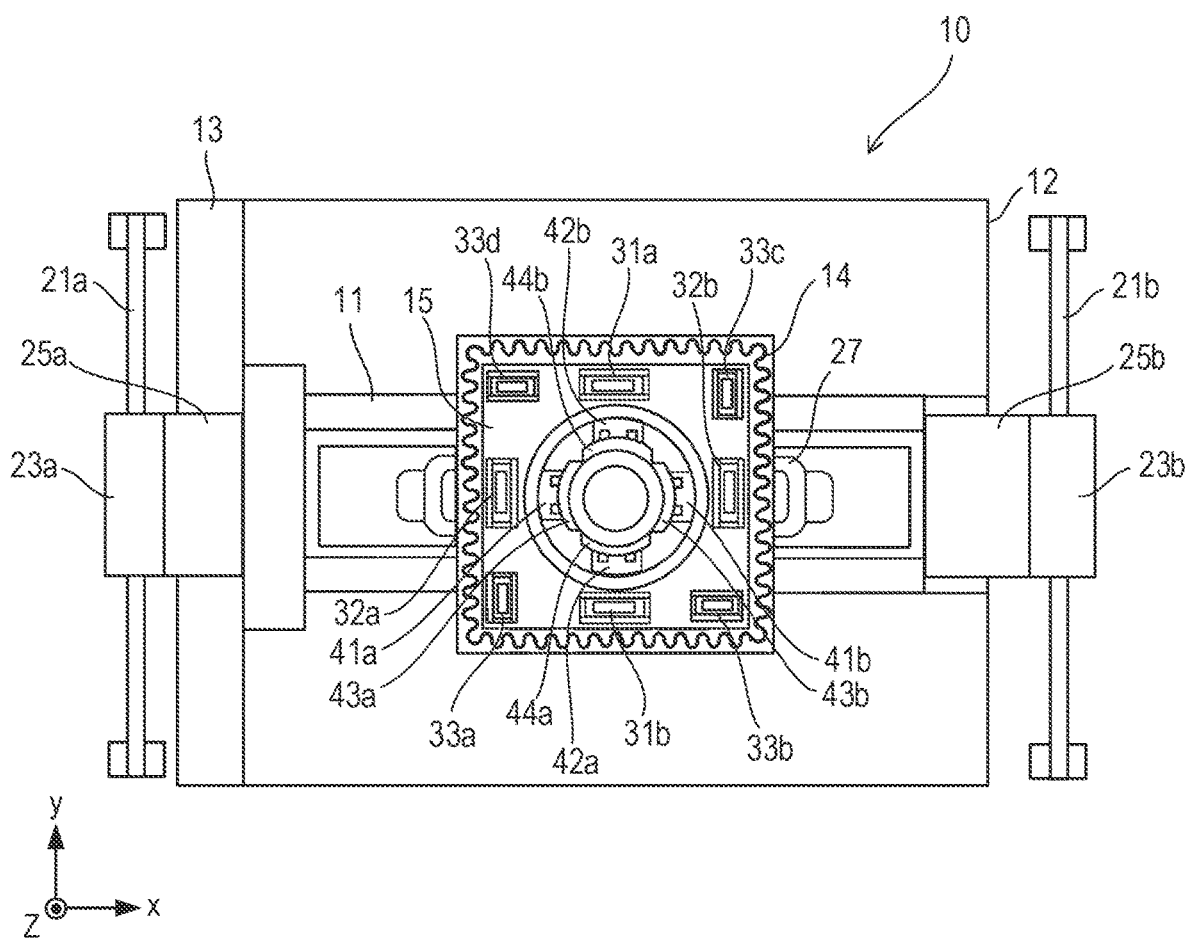
FIG. 7 is a top view for schematically illustrating a stage apparatus installed in an exposure apparatus including the control apparatus according to the first embodiment.

FIG. 7 is a top view for schematically illustrating a stage apparatus 10 installed in an exposure apparatus including control apparatus 100 according to a first embodiment of the present invention.

In FIG. 7, a direction extending from the back to the front of the drawing sheet is defined as a z-axis direction, a direction extending perpendicularly to the z-axis direction toward the right side of the drawing sheet is defined as an x-axis direction, and a direction extending perpendicularly to the z-axis direction and the x-axis direction toward the upper side of the drawing sheet is defined as a y-axis direction.

The stage apparatus 10 includes a y coarse movement stage 11, a fine movement stage 14, and an x coarse movement stage 15.

The y coarse movement stage 11 is driven along the y-axis direction with use of a surface plate 12 having a mirror-finished guide surface for the y coarse movement stage 11, a yaw guide 13, and a static pressure guide (not shown).

The x coarse movement stage 15 is provided to sandwich, in the y-axis direction, the y coarse movement stage 11 with a static pressure guide (not shown) being provided on the surface plate 12, and is driven in the x-axis direction along the y coarse movement stage 11.

A y coarse movement linear motor for driving the y coarse movement stage 11 includes movable elements 23a and 23b formed from coils.

The y coarse movement stage 11 is connected to the y coarse movement linear motor via connecting plates 25a and 25b, and subjected to positioning control by a control system (not shown) and the y coarse movement linear motor.

An x coarse movement linear motor for driving the x coarse movement stage 15 includes a stator 27 provided on the y coarse movement stage 11 and a movable element (not shown).

The x coarse movement stage 15 is subjected to positioning control in the x-axis direction by the x coarse movement linear motor and a control system (not shown).

The fine movement stage 14 is provided on the x coarse movement stage 15. Fine movement x linear motors 31a and 31b configured to generate driving force in the x-axis direction, and fine movement y linear motors 32a and 32b configured to generate driving force in the y-axis direction are provided between the x coarse movement stage 15 and the fine movement stage 14. Further, fine movement z linear motors 33a, 33b, 33c, and 33d configured to generate driving force in the z-axis direction are provided between the x coarse movement stage 15 and the fine movement stage 14.

As described below, those fine movement linear motors are driven on an axis basis by separate control apparatus 100, to thereby enable positioning control on the fine movement stage 14 along six axes (x axis, y axis, z axis, and rotational directions around those axes).

FIG. 1 is a block diagram for illustrating one of the control apparatus 100 according to the first embodiment.

The control apparatus 100 includes an amplifier (current source) 20, a controller (control unit) 50, and a detector (first detection unit) 70.

The amplifier 20 is configured to output current Iout for driving a linear motor LM (driving unit) for the fine movement stage 14. The linear motors LM correspond to any one of the fine movement x linear motor, the fine movement y linear motor, and the fine movement z linear motor.

As illustrated in FIG. 1, the detector 70 is configured to detect a position (driving state) of the fine movement stage 14, and the controller 50 is configured to transmit a command value Command to the amplifier 20 based on a result of the detection by the detector 70.

In the amplifier 20, a switching controller 20a is configured to switch on one of two combinations, that is, a first combination of switching circuits H1 and L2 and a second combination of switching circuits H2 and L1, and switch off the other combination in accordance with the transmitted command value Command and a reference triangular wave Wst. In short, the amplifier 20 adopts a PWM method.

Figure 2A:
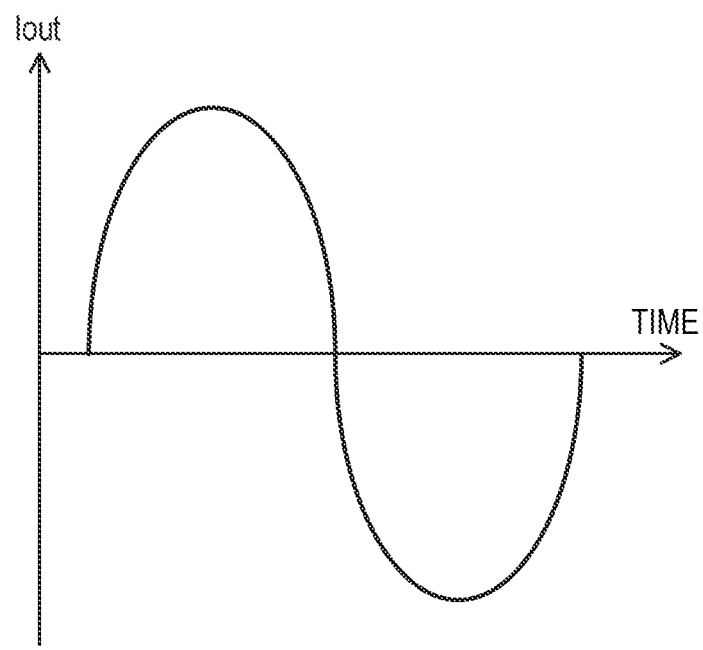
FIG. 2A is a chart for schematically showing a waveform of output current from the control apparatus according to the first embodiment.

With this operation, desired current Iout can be output, which has a ripple waveform having frequency components corresponding to a frequency Fsw of the reference wave Wst as shown in FIG. 2A.

Actually, when the first combination of switching circuits H1 and L2 and the second combination of switching circuits H2 and L1 are both turned on in the amplifier 20, through-current flows between a power supply voltage +V side and a power supply voltage −V side.

In this case, the generated through-current causes heat generation and breakdown of the switching circuits H1, H2, L1, and L2.

Such through-current may be possibly generated upon turning on one combination switched from the other combination.

The generation of the through-current can be suppressed by setting a period in which the first combination of switching circuits H1 and L2 and the second combination of switching circuits H2 and L1 are both turned off, that is, a dead time. This configuration is generally used in the PWM method.

Figure 2B:
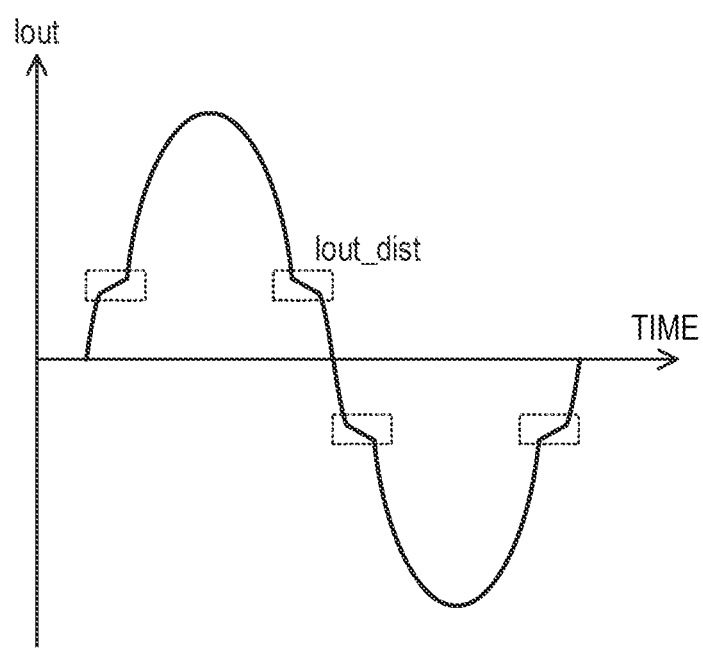
FIG. 2B is a chart for schematically showing a waveform of output current from the control apparatus according to the first embodiment.

In this case, it is known that when the dead time is set, distortion occurs at specific offset current values as indicated by Iout_dist in FIG. 2B.

Specifically, the command value Command is changed with respect to the reference triangular wave Wst, to thereby offset current to be output from the amplifier 20. At this time, distortion occurs when a reference value of a driver matches any value on and around an inflection point of the current change at which the dead time is generated.

Upon settling the fine movement stage 14, desired offset current is required in settling of the fine movement stage 14, for example, because of disturbance caused by other components of magnets used in the fine movement linear motors and by installation of cables.

At this time, when the offset current required in settling of the fine movement stage 14 matches distortion-involved output current Iout_dist of the amplifier 20, a control delay occurs in connection with control characteristics for the fine movement stage 14, and performance of the exposure apparatus is disadvantageously lowered.

Figure 3:
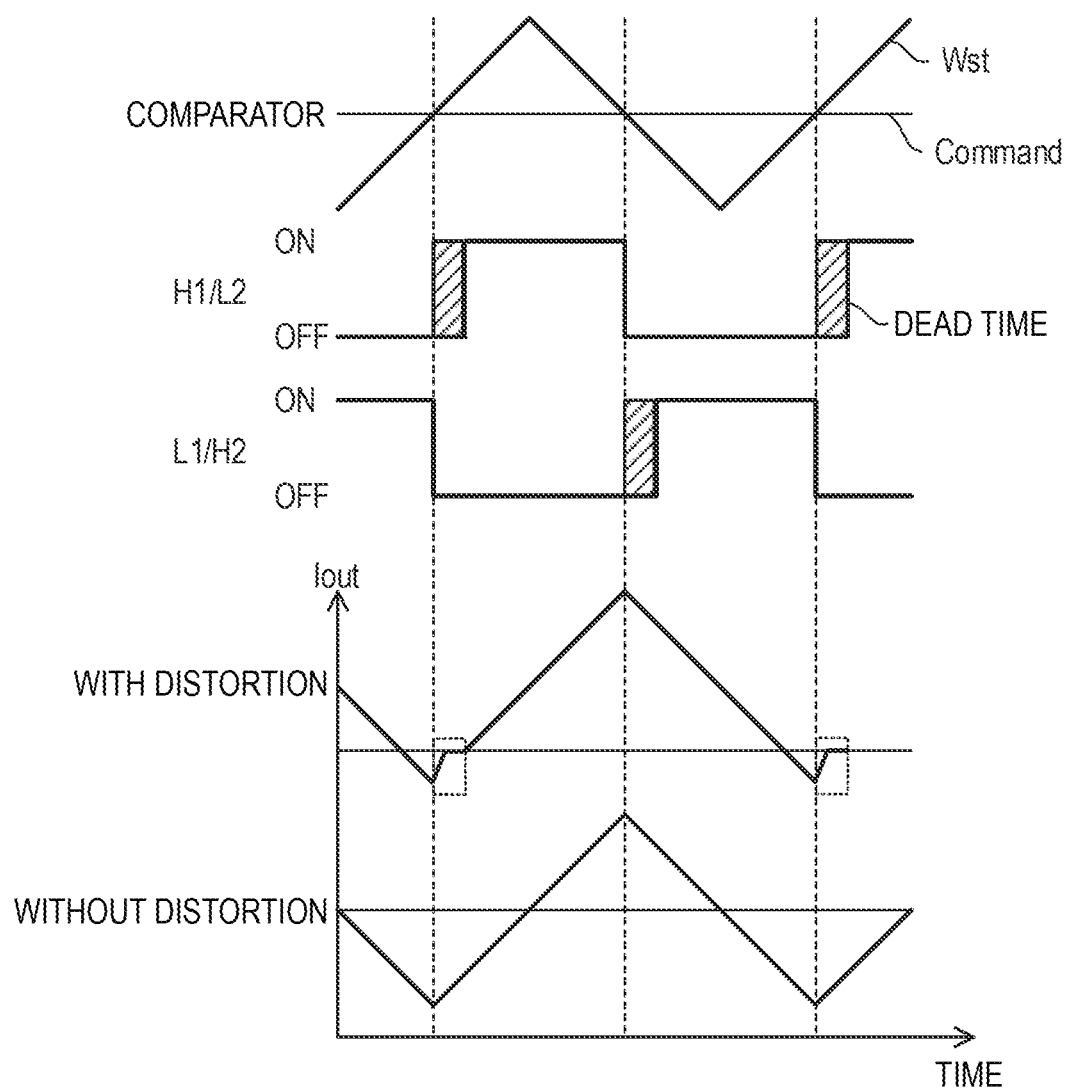
FIG. 3 shows charts for schematically showing how distortion occurs in output current from the control apparatus according to the first embodiment.

FIG. 3 shows charts for schematically showing how distortion occurs in the output current Iout from the control apparatus 100.

As shown in FIG. 3, when the reference wave Wst and the command value Command, which are input to a comparator (not shown) in the amplifier 20, cross each other, one of the first combination of switching circuits H1 and L2 and the second combination of switching circuits H2 and L1 is switched to the other, and the other combination is turned on.

In this case, a predetermined dead time is set before switching an off state to an on state so as to suppress generation of the through-current described above.

In this state, as shown in FIG. 3, when the polarity of the output current Iout is not inverted during the dead time, the output current Iout without distortion can be obtained.

As shown in FIG. 3, however, when the polarity of the output current Iout is inverted during the dead time, the current of the inverted polarity cannot be controlled, and hence distortion occurs in the output current Iout.

This output current is represented by Iout_dist. In this case, the current Iout of a waveform having distortion at portions as indicated by Iout_dist in FIG. 2B is output.

Figure 4A:
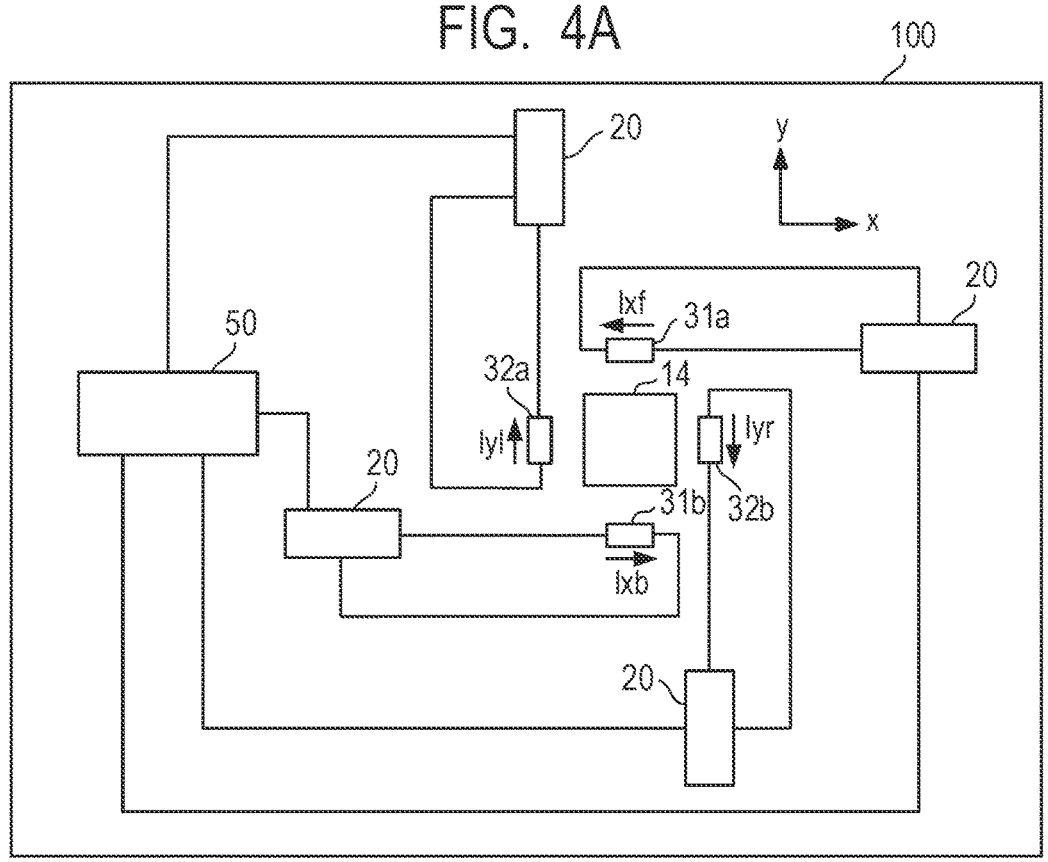
FIG. 4A is a diagram for illustrating how the control apparatus according to the first embodiment controls a fine movement stage.
Figure 4B:
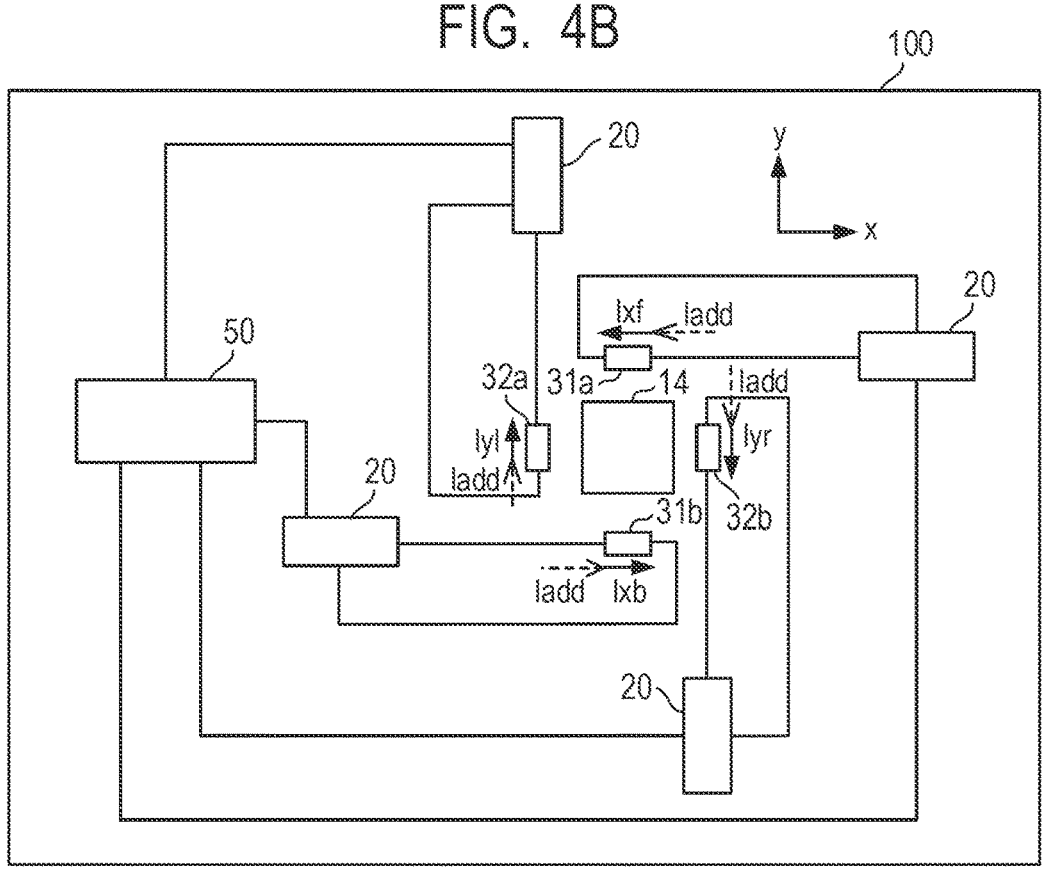
FIG. 4B is a diagram for illustrating how the control apparatus according to the first embodiment controls the fine movement stage.

FIG. 4A and FIG. 4B are diagrams for illustrating how to control the fine movement x linear motors 31a and 31b configured to generate driving force for the fine movement stage 14 in the x-axis direction, and the fine movement y linear motors 32a and 32b configured to generate driving force for the fine movement stage 14 in the y-axis direction.

As illustrated in FIG. 4A, separate amplifiers 20 are provided for the fine movement x linear motors 31a and 31b and the fine movement y linear motors 32a and 32b, and caused to output currents Ixf, Ixb, Iyl, and Iyr by the controller 50.

Upon settling the fine movement stage 14, predetermined thrust force is required in the x-axis direction and the y-axis direction so as to control the fine movement stage 14 in a predetermined position in the rotational direction.

The thrust force is proportional to a total value of control currents for the linear motors from the plurality of amplifiers 20. Specifically, this total value Istage can be represented by the vector sum of the currents Ixf, Ixb, Iyl, and Iyr.

In this example, the distortion-involved output current Iout_dist (predetermined value) as described above is measured in advance in a corresponding amplifier 20, and stored in the controller 50.

At this time, when any one of the currents Ixf, Ixb, Iyl, and Iyr matches the distortion-involved output current Iout_dist stored in the controller 50, the fine movement stage 14 is disadvantageously controlled with a delay due to the distortion of the output current Iout from the amplifier 20. As a result, an accuracy of positional control on the fine movement stage 14 is lowered.

To address this, as illustrated in FIG. 4B, offset current Iadd is added to each of the currents Ixf, Ixb, Iyl, and Iyr for the fine movement x linear motors 31a and 31b and the fine movement y linear motors 32a and 32b while maintaining the total value Istage.

Consequently, the currents Ixf, Ixb, Iyl, and Iyr can be changed not to match the distortion-involved output current Iout_dist without changing the total value Istage.

In this way, through changing current required in settling of the fine movement stage 14 not to match distortion of the distortion-involved output current of a corresponding amplifier 20, any reduction in stage control accuracy can be prevented.

As described above, in the exposure apparatus including the control apparatus 100 according to the first embodiment, the fine movement stage 14 can be controlled with high accuracy by changing current required in settling of the fine movement stage 14 in accordance with the distortion-involved output current of a corresponding amplifier 20.

In the control apparatus 100 according to the first embodiment, the distortion-involved output current Iout_dist of a corresponding amplifier 20 can be changed as well in accordance with the current required in settling of the fine movement stage 14.

Specifically, the distortion-involved output current Iout_dist of a corresponding amplifier 20 can be varied through changing the settings of the amplifier 20 (for example, changing the dead time, the switching frequency Fsw, or filter constant).

Further, a feedback control mechanism described below in a second embodiment of the present invention can be used instead.

Alternatively, the current required in settling of the fine movement stage 14 can be changed by changing a distance between the fine movement stage 14 and the x coarse movement stage 15.

Second Embodiment

Figure 5:
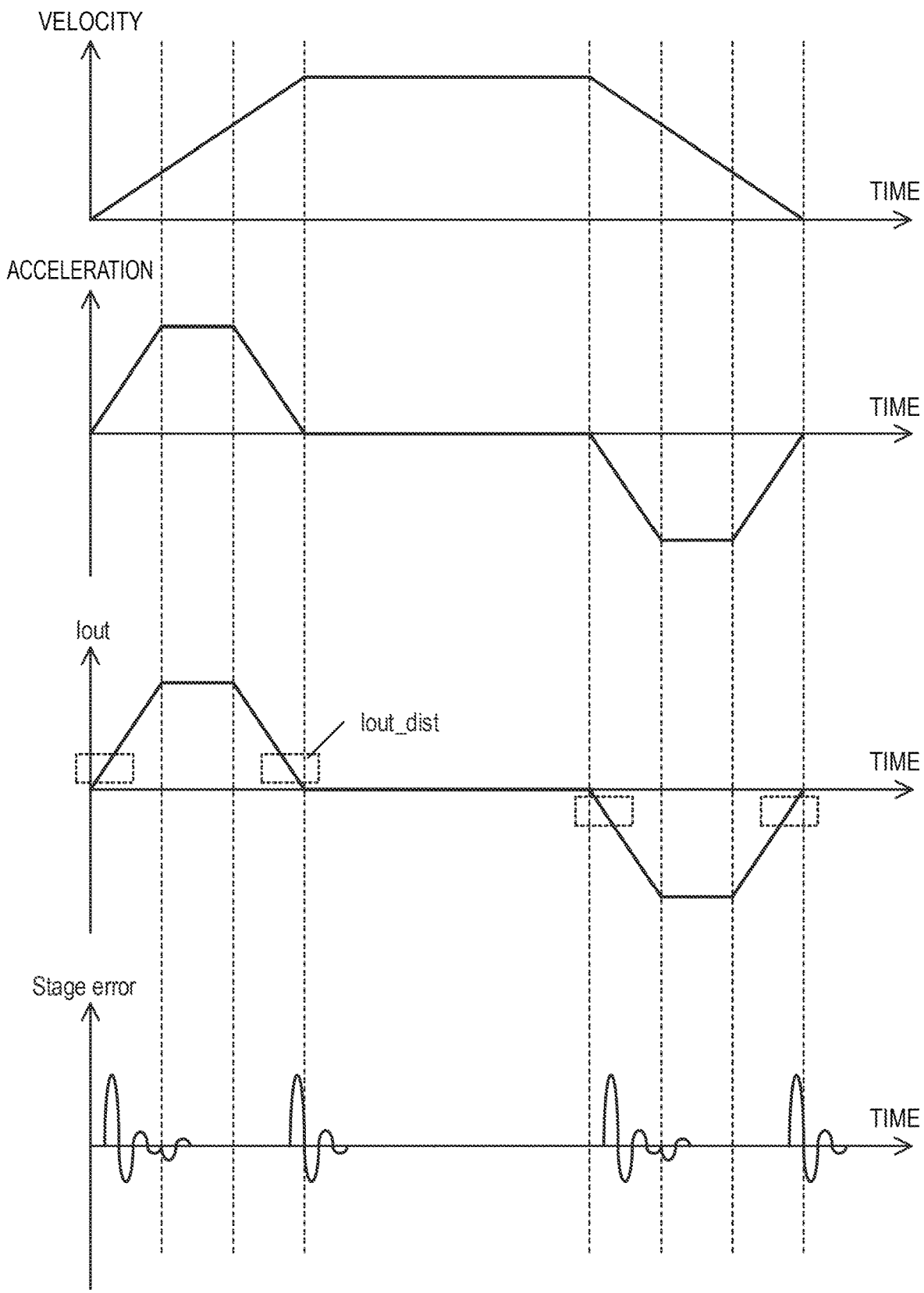
FIG. 5 shows charts for schematically showing drive profiles of a fine movement stage in an exposure apparatus including control apparatus according to a second embodiment of the present invention.

FIG. 5 shows charts for showing drive profiles of the fine movement stage 14 in an exposure apparatus including control apparatus 200 according to the second embodiment.

Components of the control apparatus 200 according to the second embodiment, which are the same as those of the control apparatus 100 according to the first embodiment, are denoted by identical reference symbols, and the descriptions regarding the components are omitted.

As illustrated in FIG. 5, the fine movement stage 14 is driven with accelerated driving, constant-velocity driving, and decelerated driving being switched.

In this case, the exposure apparatus performs exposure during the constant-velocity driving of the fine movement stage 14, and hence highly accurate positional control is required for the fine movement stage 14 during the constant-velocity driving.

The current required to drive the fine movement stage 14 varies for the accelerated driving, the constant-velocity driving, and the decelerated driving, and thus changes constantly upon switching the accelerated driving, the constant-velocity driving, and the decelerated driving.

Further, predetermined current is required in the accelerated driving just before the constant-velocity driving, and the required current is reduced in a constant-velocity drive section.

At this time, however, when the current required for the accelerated driving of the fine movement stage 14 matches the distortion-involved output current of a corresponding amplifier 20, a response of the amplifier 20 is delayed, and the positional control on the fine movement stage 14 transiently worsens.

Consequently, as illustrated in FIG. 5, a large error Stage error of the fine movement stage 14 remains in the constant-velocity drive section.

Specifically, the error Stage error increases due to the effect of the distortion-involved output current Iout_dist of the output current Iout from the amplifier 20, and disadvantageously affects the accuracy of controlling the fine movement stage 14 in the constant-velocity drive section.

Figure 6:
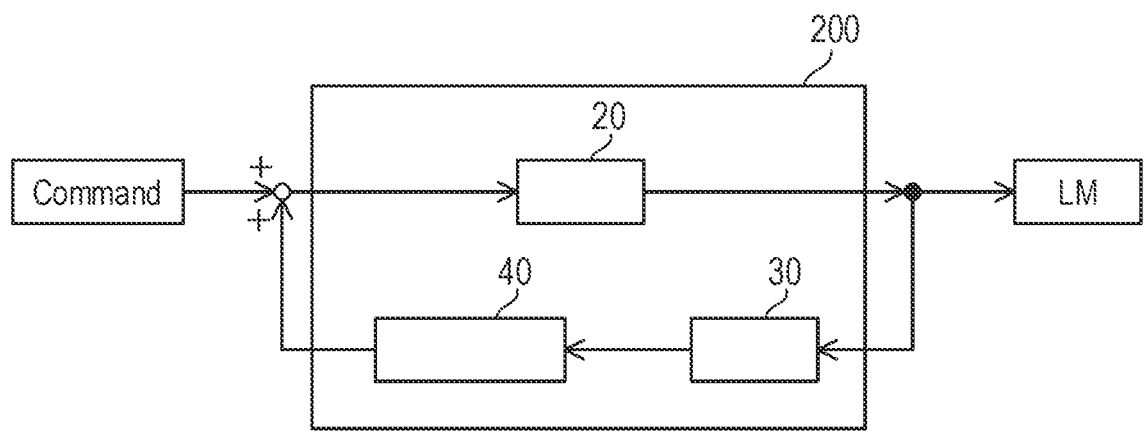
FIG. 6 is a block diagram for illustrating one of the control apparatus according to the second embodiment.

FIG. 6 is a control block diagram for illustrating one of control apparatus 200 according to the second embodiment.

As illustrated in FIG. 6, in the control apparatus 200 of the second embodiment, a monitor 30 (second detection unit) is provided to monitor the output current Iout from a corresponding amplifier 20.

Further, when the monitor 30 detects that the output current Iout matches the distortion-involved output current Iout_dist, a compensation current source 40 is caused to supply the offset current Iadd so as to compensate for the output current Iout.

In this way, the control apparatus 200 according to the second embodiment can prevent the error of the fine movement stage 14 from increasing due to the distortion-involved output current Iout_dist by feedback control of the output current Iout from a corresponding amplifier 20. Therefore, the accuracy of controlling the fine movement stage 14 can be maintained.

In the control apparatus 200 according to the second embodiment, the feedback control of the output current Iout is performed. However, this feedback control can be also performed by changing a control gain (not shown) and compensating for the output current Iout with the gain.

In this case, when the gain is increased excessively, oscillation is induced in a large-current output region or a high-frequency region. To avoid this, it may be effective to provide a limiter to a gain compensation circuit.

As described above, in the control apparatus 200 according to the second embodiment, in the drive section of the fine movement stage 14 (during driving), the feedback control is performed so as to compensate for the output current in accordance with the distortion-involved output current of a corresponding amplifier 20. With this operation, the fine movement stage 14 can be controlled with high accuracy.

In the control apparatus 200 according to the second embodiment, the distortion-involved output current Iout_dist of a corresponding amplifier 20 can also be changed in accordance with current required in the drive section of the fine movement stage 14.

Specifically, the distortion-involved output current Iout_dist of a corresponding amplifier 20 can be varied through changing the settings of the amplifier 20 (for example, changing the control gain in the amplifier 20).

Further, the current required in the drive section of the fine movement stage 14 can be changed as well through changing the distance between the fine movement stage 14 and the x coarse movement stage 15.

The control apparatus 200 is also applicable to a case in which the required current and the distortion-involved output current Iout_dist of a corresponding amplifier 20 match or affect each other even after the settling of the fine movement stage 14.

Further, in the control apparatus 200 according to the second embodiment, the output current Iout from a corresponding amplifier 20 is subjected to feedback control, but the present invention is not limited thereto. Alternatively, the fine movement stage 14 can be controlled with high accuracy by feedforward control of the output current Iout from a corresponding amplifier 20 to reduce any effect of the distortion.

The exemplary embodiments of the present invention are described above, but the present invention is not limited to these embodiments and can be modified and changed variously within the scope of the gist thereof.

(Embodiment Relating to Manufacturing Method for Article)

A manufacturing method for a device (for example, semiconductor integrated circuit element or liquid crystal display element) as an article includes a step of forming a pattern on a substrate (wafer, glass plate, or film-like substrate) with use of the exposure apparatus including the control apparatus described above. The manufacturing method may further include a step of developing the substrate having formed thereon the pattern, and a step of etching certain portions of the substrate. In manufacturing a patterned medium (recording medium), an optical element, or other such articles, the manufacturing method may include executing, instead of etching, other processing such as processing of the substrate on which the pattern is formed. The manufacturing method for an article of the embodiment is advantageous in terms of at least one of performance, quality, yield, and production costs of the article as compared with related-art methods.

According to the present invention, the control apparatus with which driving of the driving unit can be controlled with high accuracy with a simple configuration, the exposure apparatus, and the manufacturing method for an article can be provided.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-013061, filed Jan. 29, 2019, which is hereby incorporated by reference herein in its entirety.

What is claimed is:

1. A control apparatus for controlling a driving unit, the control apparatus comprising:
    a plurality of current sources each being configured to supply current based on a PWM method;
    a first detection unit configured to detect a driving state of the driving unit; and
    a control unit configured to change values of a plurality of currents which are supplied from the plurality of current sources based on a result of the detection by the first detection unit, and which are required to drive the driving unit, in a case where a value of at least one of the plurality of currents is a predetermined value, such that a total value expressed by a vector sum of the plurality of currents is not changed,
    wherein a thrust force generated by the driving unit is proportional to the total value expressed by the vector sum of the plurality of currents.

2. The control apparatus according to claim 1, wherein the control unit is configured to compare the values of the plurality of currents required to drive the driving unit and the predetermined value stored in the control unit.

3. The control apparatus according to claim 1, further comprising a second detection unit configured to detect the plurality of currents,
    wherein the control unit is configured to change the values of the plurality of currents in a case where the second detection unit detects that a value of at least one of the plurality of currents is the predetermined value.

4. The control apparatus according to claim 1, wherein the predetermined value is a value of current which involves distortion caused by the PWM method, and which is measured in the plurality of current sources.

5. The control apparatus according to claim 1, wherein the predetermined value is a value of current required in settling of the driving unit.

6. The control apparatus according to claim 1, wherein the predetermined value is a value of current required in driving of the driving unit.

7. The control apparatus according to claim 1, wherein the predetermined value is a value of the at least one of the plurality of currents when a distortion in a value of the at least one of the plurality of currents with respect to a time occurs by providing the time when the at least one of the plurality of currents is not supplied from at least one of the plurality of current sources.

8. An exposure apparatus comprising:
    a control apparatus for controlling a driving unit, the control apparatus comprising:
        a plurality of current sources each being configured to supply current based on a PWM method;
        a first detection unit configured to detect a driving state of the driving unit; and
        a control unit configured to change values of a plurality of currents which are supplied from the plurality of current sources based on a result of the detection by the first detection unit, and which are required to drive the driving unit, in a case where a value of at least one of the plurality of currents is a predetermined value, such that a total value expressed by a vector sum of the plurality of currents is not changed,
        wherein a thrust force generated by the driving unit is proportional to the total value expressed by the vector sum of the plurality of currents; and
    a stage driven with use of current supplied by the control apparatus.

9. A manufacturing method for an article comprising:
exposing a substrate using an exposure apparatus comprising:
    a control apparatus for controlling a driving unit, the control apparatus comprising:
        a plurality of current sources each being configured to supply current based on a PWM method;
        a first detection unit configured to detect a driving state of the driving unit; and
        a control unit configured to change values of a plurality of currents which are supplied from the plurality of current sources based on a result of the detection by the first detection unit, and which are required to drive the driving unit, in a case where a value of at least one of the plurality of currents is a predetermined value, such that a total value expressed by a vector sum of the plurality of currents is not changed, wherein a thrust force generated by the driving unit is proportional to the total value expressed by the vector sum of the plurality of currents; and
a stage driven with use of current supplied by the control apparatus; and
developing the substrate,
wherein the article is manufactured from the developed substrate.

10. A control apparatus for controlling a driving unit with a plurality of linear motors, the control apparatus comprising:
a plurality of current sources each being configured to supply current to a corresponding linear motor of the plurality of linear motors based on a PWM method;
a first detection unit configured to detect a driving state of the driving unit; and
a control unit configured to change values of a plurality of currents which are supplied from the plurality of current sources based on a result of the detection by the first detection unit, and which are required to drive the driving unit, in a case where a value of at least one of the plurality of currents is a predetermined value, such that a thrust force generated by driving unit is not changed,
wherein each of the plurality of linear motors generates a thrust force in a different direction from each other, and
wherein the thrust force generated by the driving unit corresponds to a sum of the respective thrust forces generated by the plurality of linear motors.

11. The control apparatus according to claim 10, wherein the control unit is configured to compare the values of the plurality of currents required to drive the driving unit and the predetermined value stored in the control unit.

12. The control apparatus according to claim 10, further comprising a second detection unit configured to detect the plurality of currents,
wherein the control unit is configured to change the values of the plurality of currents in a case where the second detection unit detects that a value of at least one of the plurality of currents is the predetermined value.

13. The control apparatus according to claim 10, wherein the predetermined value is a value of current which involves distortion caused by the PWM method, and which is measured in the plurality of current sources.

14. The control apparatus according to claim 10, wherein the predetermined value is a value of current required in settling of the driving unit.

15. The control apparatus according to claim 10, wherein the predetermined value is a value of current required in driving of the driving unit.

16. An exposure apparatus comprising:
a control apparatus for controlling a driving unit with a plurality of linear motors, the control apparatus comprising:
a plurality of current sources each being configured to supply current to a corresponding linear motor of the plurality of linear motors based on a PWM method;
a first detection unit configured to detect a driving state of the driving unit; and
a control unit configured to change values of a plurality of currents which are supplied from the plurality of current sources based on a result of the detection by the first detection unit, and which are required to drive the driving unit, in a case where a value of at least one of the plurality of currents is a predetermined value, such that a thrust force generated by driving unit is not changed,
wherein each of the plurality of linear motors generates a thrust force in a different direction from each other, and
wherein the thrust force generated by the driving unit corresponds to a sum of the respective thrust forces generated by the plurality of linear motors; and
a stage driven with use of current supplied by the control apparatus.

17. A manufacturing method for an article comprising:
exposing a substrate using an exposure apparatus comprising:
a control apparatus for controlling a driving unit with a plurality of linear motors, the control apparatus comprising:
a plurality of current sources each being configured to supply current to a corresponding linear motor of the plurality of linear motors based on a PWM method;
a first detection unit configured to detect a driving state of the driving unit; and
a control unit configured to change values of a plurality of currents which are supplied from the plurality of current sources based on a result of the detection by the first detection unit, and which are required to drive the driving unit, in a case where a value of at least one of the plurality of currents is a predetermined value, such that a thrust force generated by driving unit is not changed,
wherein each of the plurality of linear motors generates a thrust force in a different direction from each other, and
wherein the thrust force generated by the driving unit corresponds to a sum of the respective thrust forces generated by the plurality of linear motors; and
a stage driven with use of current supplied by the control apparatus; and developing the substrate,
wherein the article is manufactured from the developed substrate.

* * * * *